(12) United States Patent
Liu et al.

(10) Patent No.: US 8,736,145 B2
(45) Date of Patent: May 27, 2014

(54) ELECTROMECHANICAL TRANSDUCER DEVICE AND METHOD OF FORMING A ELECTROMECHANICAL TRANSDUCER DEVICE

(75) Inventors: Lianjun Liu, Chandler, AZ (US); Sergio Pacheco, Scottsdale, AZ (US); Francois Perruchot, Grenoble (FR); Emmanuel Defay, Voreppe (FR); Patrice Rey, Saint Jean de Moirans (FR)

(73) Assignees: Freescale Semiconductor, Inc., Austin, TX (US); Commissariar á l'Energie Atomique at aux Energies Alternatives (CEA), Paris (FR)

( * ) Notice: Subject to any disclaimer, the term of this patent is extended or adjusted under 35 U.S.C. 154(b) by 294 days.

(21) Appl. No.: 13/128,032

(22) PCT Filed: Nov. 25, 2009

(86) PCT No.: PCT/IB2009/056019
§ 371 (c)(1),
(2), (4) Date: May 6, 2011

(87) PCT Pub. No.: WO2010/061363
PCT Pub. Date: Jun. 3, 2010

(65) Prior Publication Data
US 2011/0221307 A1    Sep. 15, 2011

(30) Foreign Application Priority Data

Nov. 26, 2008  (WO) .................. PCT/IB2008/055651

(51) Int. Cl.
*H01L 41/06*  (2006.01)
*H01L 41/09*  (2006.01)

(52) U.S. Cl.
USPC ............................. 310/331; 310/26; 310/346

(58) Field of Classification Search
USPC .................... 310/339, 346, 331, 26
See application file for complete search history.

(56) References Cited

U.S. PATENT DOCUMENTS 5,796,152 A * 8/1998 Carr et al. .................. 257/415
6,309,048 B1  10/2001 Silverbrook
(Continued)

FOREIGN PATENT DOCUMENTS

JP    H05-296713 A    11/1993
JP    H06-283083 A    10/1994
(Continued)

OTHER PUBLICATIONS

Hsueh, C.H. et al, "Thermal Stresses in Elastic Multilayer Systems," Thin Solid Films, copyright 2002 Elsevier Science B.V.; vol. 418, issue 2; Oct. 2002; pp. 182-188.

(Continued)

*Primary Examiner* — Thomas Dougherty

(57) ABSTRACT

A micro or nano electromechanical transducer device formed on a semiconductor substrate comprises a movable structure which is arranged to be movable in response to actuation of an actuating structure. The movable structure comprises a mechanical structure having at least one mechanical layer having a first thermal response characteristic, at least one layer of the actuating structure having a second thermal response characteristic different to the first thermal response characteristic, and a thermal compensation structure having at least one thermal compensation layer. The thermal compensation layer is different to the at least one layer and is arranged to compensate a thermal effect produced by the mechanical layer and the at least one layer of the actuating structure such that the movement of the movable structure is substantially independent of variations in temperature.

18 Claims, 8 Drawing Sheets

(56) References Cited

U.S. PATENT DOCUMENTS

| | | | |
|---|---|---|---|
| 6,631,979 B2 * | 10/2003 | Lebens et al. | 347/54 |
| 6,639,713 B2 | 10/2003 | Chiu et al. | |
| 6,700,309 B2 * | 3/2004 | Dausch et al. | 310/330 |
| 6,746,891 B2 | 6/2004 | Cunningham et al. | |
| 7,675,222 B2 * | 3/2010 | Kawakubo et al. | 310/328 |
| 7,919,903 B2 * | 4/2011 | Hong et al. | 310/328 |
| 2002/0043895 A1 | 4/2002 | Richards et al. | |
| 2003/0062332 A1 | 4/2003 | Harris et al. | |
| 2003/0227234 A1 | 12/2003 | Namerikawa et al. | |
| 2005/0116798 A1 | 6/2005 | Bintoro et al. | |
| 2005/0127792 A1 | 6/2005 | Mehta | |
| 2005/0275696 A1 | 12/2005 | Miyazawa et al. | |
| 2006/0171628 A1 | 8/2006 | Naniwada | |
| 2006/0204776 A1 | 9/2006 | Chen et al. | |
| 2007/0257766 A1 | 11/2007 | Richards et al. | |
| 2008/0002299 A1 | 1/2008 | Thurn | |
| 2008/0169724 A1 * | 7/2008 | Bhattacharjee et al. | 310/313 B |
| 2008/0202239 A1 | 8/2008 | Fazzio et al. | |
| 2009/0026892 A1 * | 1/2009 | Nakamura et al. | 310/367 |
| 2011/0233693 A1 | 9/2011 | Perruchot et al. | |
| 2012/0056308 A1 | 3/2012 | Perruchot et al. | |

FOREIGN PATENT DOCUMENTS

| | | |
|---|---|---|
| JP | H06283083 | 10/1994 |
| JP | 2002237245 | 8/2002 |
| JP | 2003208841 | 7/2003 |
| JP | 2005-279831 A | 10/2005 |
| WO | 2006025456 A1 | 3/2006 |
| WO | 2010/061364 A2 | 6/2010 |
| WO | 2011001293 A2 | 1/2011 |

OTHER PUBLICATIONS

Jiang, H. et al., "Fabrication of PZT Actuated Cantilevers on Silicon-on-Insulator Wafers for a RF Microswitch," Micromachining and Microfabrication Process Technology VIII; San Jose, CA, USA; 2003; pp. 165-173.

Pulskamp, J. et al., "Mitigation of Residual Film Stress Deformation in Multilayer Microelectromechanical Ssytems Cantilever," IEEE Journal of Vacuum Science & Technology B: Microelectronic and Nanometer Structures; vol. 21, issue 6; Nov. 2003; pp. 2482-2486.

International Search Report mailed May 18, 2010 for International Application No. PCT/IB2009/053235, 4 pages.

International Search Report mailed May 12, 2010 for International Application No. PCT/IB2009/056020, 3 pages.

Hee-Chul Lee et al: "Design, Fabrication and RF Performances of Two Different Types of Piezoelectrically Actuated Ohmic MEMS Switches; Design, Fabrication and RF Performances of Two Different Types of Piezoelectrically Actuated Ohmic MEMS Switches" Journal of Micromechanics & Microengineering, Institute of Physics Publishing, Bristol, GB, vol. 15, No. 11, Nov. 1, 2005, pp. 2098-2104.

Hsueh C H: "Thermal Stresses in Elastic Multilayer Systems" Thin Solid Films, vol. 418, Issue 2, Oct. 2002, pp. 182-188, Copyright 2002 Elsevier Science B.V.

Hong Zhu et al: "Membrane Microcantilever Array Fabrication with PZT Thin Films for Nanorange Movement" Microsystem Technologies; Micro and Nanosystems Information Storage and Processing Systems, Springer, Berlin, DE, vol. 11, No. 8-10, Aug. 1, 2005, pp. 1121-1126.

Pulskamp Jeffrey S et al: "Mitigation of Residual Film Stress Deformation in Multilayer Microeclectromechanical Systems Cantilever" IEEE, Journal of Vacuum Science & Technology B: Microelectronic and Nanometer Structures, vol. 21, Issue 6, Nov. 2003, p. 2482.

International Search Report and Written Opinion correlating to PCT/IB2009/056019 dated May 17, 2010.

Notice of Allowance mailed Jan. 23, 2013 for U.S. Appl. No. 13/128,035, 15 pages.

Notice of Allowance mailed Mar. 6, 2013 for U.S. Appl. No. 13/320,579, 19 pages.

* cited by examiner

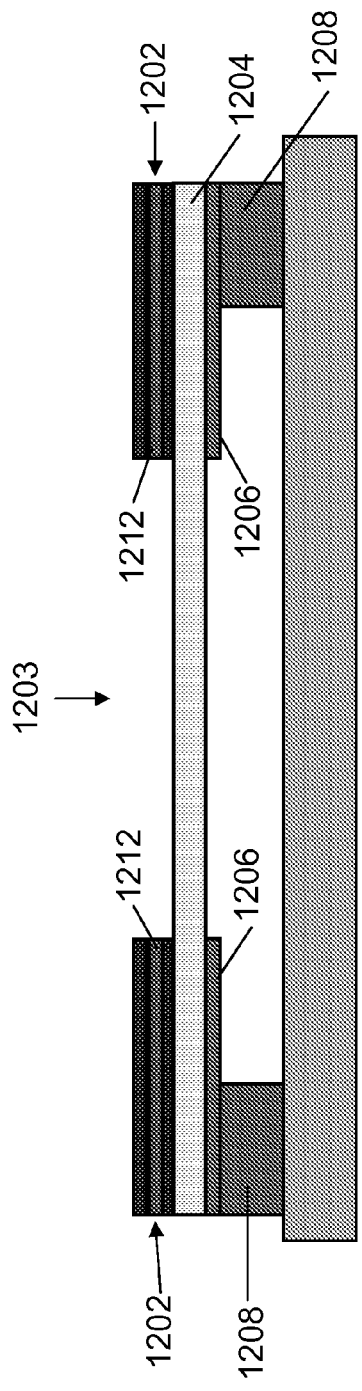
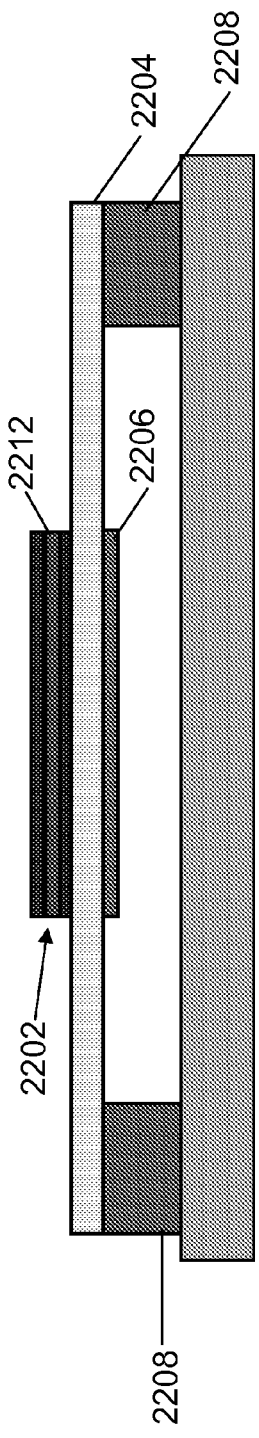
Figure 11
Figure 12

ELECTROMECHANICAL TRANSDUCER DEVICE AND METHOD OF FORMING A ELECTROMECHANICAL TRANSDUCER DEVICE

FIELD OF THE INVENTION

This disclosure relates to micro or nano electromechanical transducer devices and methods of forming micro or nano electromechanical transducer devices.

BACKGROUND OF THE INVENTION

ElectroMechanical Systems include Micro ElectroMechanical Systems (MEMS) structures and Nano ElectroMechanical Systems (NEMS). MEMS and NEMS structures are used in a wide variety of applications including, for example, MEMS accelerometers in cars for airbag deployment or in consumer electronic devices such as game controllers, MEMS gyroscopes used in cars to detect yaw, optical switching, bio-MEMS applications, MEMS loudspeakers, inkjet printers and RF MEMS components such as antenna phase shifters. Advantages of using MEMS structures include they have mechanical properties but have small dimensions and can be manufactured using existing semiconductor processing technologies.

A MEMS transducer device, which may be used as an actuator or sensor, may include a movable structure fabricated on a semiconductor substrate including at least one mechanical stack comprising one or more mechanical layers of a material such as silicon or silicon nitride and at least one functional/actuating stack whose function is to facilitate the movement of the mechanical stack on actuation of the device. The actuating stack comprises one or more layers whose arrangement and function in relation to the mechanical stack depends on the type of MEMS transducer device. For example, in an electrostatic actuated device, the actuating stack comprises a stationary electrode that cooperates with a movable electrode formed on a mechanical layer to facilitate movement of the mechanical layer and movable electrode. In a magnetic actuated device, the functional stack comprises a magnetic layer which is arranged to apply an external force to the movable mechanical stack in cooperation with an external magnet. The actuating stack can also be a multi-layered stack including at least one actuating layer of a material such as a piezoelectric or a magnetic material formed over a mechanical stack such as a mechanical beam or cantilever. Due to its electromechanical conversion properties, lead zirconate titanate ($Pb[Zr_xTi_{1-x}]O_3$ with $0<x<1$) which is generally known as PZT, is the most commonly used piezoelectric material in MEMS devices. In the case of a piezoelectrically actuated MEMS switch device such as that shown in FIG. 1, the multi-layer movable structure includes a PZT film 2 formed over a cantilever or beam 4 (which may be a silicon nitride or a silicon oxide cantilever) and electrodes 6 and 8 (which may be platinum electrodes) formed on either side of the PZT film 2 for applying a voltage across the PZT film. Contacts 10 and 12 provide the switch contacts of the device. As is well known, by applying appropriate voltages across the PZT film, the PZT film expands or contracts depending on the applied voltage by piezoelectricity which applies stress to the cantilever and results in the cantilever being deflected orthogonally (in a direction perpendicular to the stack) to open or close the MEMS switch device.

An article entitled 'Design, fabrication and RF performances of two different types of piezoelectrically actuated Ohmic MEMS switches' by Hee-Chul Lee, Jae-Hyoung Park, Jae-Yeong Park, Hyo-Jin Nam and Jong-Uk Bu in Journal of Micromechanics and Microengineering 15 (2005), pages 21098-2104, describes a piezoelectric actuated RF MEMS switch having a PZT capacitor formed on a cantilever.

US patent application no. 2005/0127792 describes a multi-layered piezoelectric switch for tunable electronic components comprising multiple piezoelectric layers, and metal layers alternated with the piezoelectric layers on a cantilever. Thus, this device uses stacked piezoelectric capacitors to form a piezoelectric actuated switch.

For MEMs transducer devices having a movable structure with at least one free end (for example, clamped with a single anchor) and being composed of multi-layer materials stacked together, the deflection of the movable structure can vary with temperature change due to the different values of the Coefficient of Thermal Expansion (CTE) for the different materials which form the movable structure as in a bimetallic strip. For example, for the piezoelectric actuated transducer of FIG. 1, the layers including the platinum (Pt) electrode 6, PZT film 2, and the platinum (Pt) electrode 8 of FIG. 1 will have a CTE of approximately 9.5 ppm/° C. compared to a CTE of 2-3 ppm/° C. of the silicon nitride cantilever 4. Thus, when the operation temperature changes, the Pt/PZT/Pt layers will expand (or contract) differently than the silicon nitride cantilever which results in changes in the transducers orthogonal deflection and thus, its performance. For example, for operation temperature changes over a 120° range, the piezoelectric MEMS switch device of FIG. 1 can experience a total deflection excursion of 7 µm. With large changes in the transducers deflection, the device may be made inoperable: for example, in the MEMS switch device of FIG. 1, the deflection due to temperature variations may cause the switch to be opened when it should be closed.

The same effect is seen in electrostatic switch devices having a movable structure with at least one free end and composed of a movable mechanical stack and a movable electrode layer formed on the moveable mechanical stack as part of the functional stack. The difference of CTE of the materials of the two layers can produce a thermal induced actuation.

The deflection described for a movable structure with at least one free end is due to the bending effect of a mechanical moment or force due to the multi-layer stack. The mechanical moment or force is typically referred to as the bending moment. This bending moment can have the same effect on other movable structures, such as, for example, clamped structures where the bending moment, due to a multilayer stack, is not present along the full structure. Such clamped structures include transducer devices having a movable structure (such as a mechanical layer or membrane) which is supported or clamped at ends of the movable structure and an actuating structure (such as a piezoelectric, electrostrictive or magnetostrictive actuating stack) located at the ends or at the centre of the movable structure. The actuating structure has a bending effect or induces a bending moment on the movable structure which causes the movable structure to move. As with the free end movable structures described above, the bending moment induced in such clamped structures may also vary with temperature variations.

It is known to provide thermal compensation in electrostatic switch devices by having additional layers which are identical and symmetrical to the movable electrode so as to compensate for the thermal behaviour of the movable structure.

For example, U.S. Pat. No. 6,746,891 describes a trilayered beam MEMS switch device which is actuated by an electrostatic charge. When a voltage is applied across a stationary electrode on a substrate and an opposing movable electrode on a movable beam, an equal and opposite charge is generated on the stationary electrode and movable electrode. The charge distribution on the opposing electrodes produces an electrostatic force that is balanced by the elastic forces on the now deformed beam. As the voltage is increased, the charge increases in a non-uniform and non-linear fashion across the surface of the beam until a stability point is reached. The stability point is defined by the inability of the elastic forces to maintain equilibrium with the electrostatic forces and the beam snaps through to establish contact between two switch contact pads. This patent describes how an electrode interconnect is formed on the beam, which electrode interconnect is a structural match or structurally similar to the movable electrode so as to provide robustness to film stress and temperature induced beam deformation. In one embodiment, this patent teaches that the electrode interconnect is fabricated of the same material and dimensioned the same in order to provide mechanical balance.

For the electrostatic actuated device, only one (movable) electrode layer, combined with a stationary electrode layer, is required for the device to function. Therefore, it is not too complex to use a symmetrical tri-layered structure to realize the thermal/stress balance. For a more complicated device having multiple layers, such as piezoelectric actuated device, at least three layers (electrode/PZT/electrode) form the functional/actuating stack and a mechanical beam layer forms the mechanical stack. This makes the thermal balance more difficult to be met. Theoretically, the same symmetrical approach as used in the electrostatic actuated device can be used in an attempt to achieve thermal balance: that is, the same three layers can be deposited on the opposite side of the mechanical beam layer. In reality, however, this is complicated by manufacturing process variations. More layers mean more processing steps and larger variations, resulting in higher cost and less reproducibility. Also, the presence of the PZT layer before mechanical beam deposition may not be allowed due to serious contamination concerns.

In view of process constraints, it is not always possible to put the same material on both sides of the mechanical stack, due to serious contamination problems or because of process conditions. For example, a metallic layer used as compensation for a metal electrode on top of a mechanical layer and made before the mechanical layer may not be compatible with the temperature deposition of the material of the mechanical layer. Thus, even for an electrostatic actuated device, there is a need to propose a solution to have improved thermal stability without using a symmetrical movable structure.

SUMMARY OF THE INVENTION

The present invention provides a electromechanical transducer device and a method of forming a electromechanical transducer device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings in which:

FIG. 11 is a schematic cross-section diagram of part of an example of a micro electromechanical transducer device in accordance with another embodiment of the disclosure; and FIG. 12 is a schematic cross-section diagram of part of an example of a micro electromechanical transducer device in accordance with another embodiment of the disclosure.

Elements in the figures are illustrated for simplicity and clarity and have not necessarily been drawn to scale.

DETAILED DESCRIPTION

In the description that follows and in some of the Figures, certain regions are identified as being of a particular material, and/or type. However, this is merely for convenience of explanation and not intended to be limiting. Those of skill in the art will understand based on the description given herein that various materials can be used and that the disclosure is not limited to the particular examples given in the description.

The present disclosure will be described with reference to a piezoelectric actuated MEMS switch device. However, it will be appreciated that the disclosure is not limited to piezoelectric actuated MEMS switch devices and applies equally to other MEMS transducer devices such as sensors, actuators, accelerometers, optical switches, varactors, variable inductors, phase shifters and magnetic or electrostatic actuated transducer devices and/or similar devices. Furthermore, the disclosure may also be used in Nano ElectroMechanical systems (NEMS) and thus is not limited to MEMS devices.

For the purpose of the disclosure, a transducer device is a device that converts one type of energy or physical attribute to another for various purposes including measurement, actuation or information transfer.

In addition, in the following description the different layers of the MEMS transducer device are described as having a certain position in the structure. However, it will be appreciated that the relative positions of the different layers are not limited to those described herein and may depend on the type of MEMS device and of the relative values of the CTE of the materials which form the layers.

Figure 2:
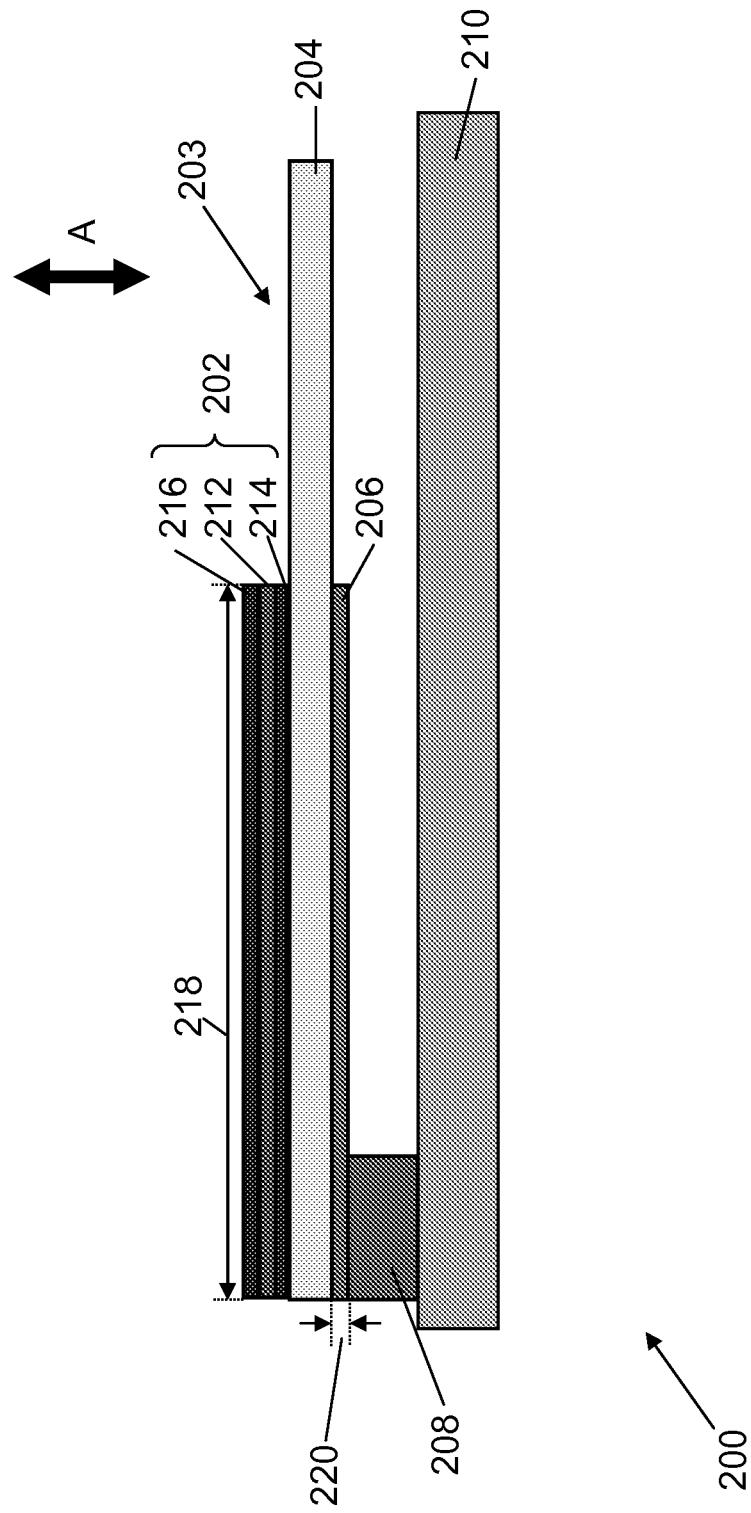
FIG. 2 is a schematic cross-section diagram of part of an example of a micro electromechanical transducer device in accordance with an embodiment of the disclosure.

Referring now to FIG. 2, an example of a micro electromechanical switch (MEMS) device 200 in accordance with an embodiment of the disclosure comprises an actuating structure comprising a plurality of layers 202 including a piezoelectric layer 212, and a movable structure 203 which is arranged to be movable in response to actuation of the actuating structure. For example, the movable structure 203 may be arranged to be movable in a direction (e.g. along line A shown in FIG. 2) which direction is substantially perpendicular to a main plane of the layers 202 of the actuating structure and movable structure 203. The movable structure 203, in the example shown in FIG. 2, includes the plurality of actuating layers 202 of the actuating structure, a mechanical structure 204 and a thermal compensation structure 206. It will be appreciated that in other MEMS devices, the actuating structure may comprise at least one layer as part of the movable structure and at least one layer which is not part of the movable structure: e.g. an electrostatic actuated device may comprise an actuating structure having a movable electrode formed as part of the movable structure and also a stationary electrode formed on a substrate. Due to process requirements, the movable structure may further comprise additional thin layers, such as for example, seed layers or buffer layers. In the example shown in FIG. 2, the mechanical structure 204 comprises a mechanical layer 204 or beam 204 and is a cantilever supported by an anchor 208 which is formed on a substrate 210. The anchor can be at one end of the structure as shown in the drawing or at a different place. The mechanical structure may alternatively comprise more than one layer. The movable structure has at least one free end. The beam 204 is arranged to be movable by the actuating structure in response to piezoelectric actuation of the actuating structure, for example, by applying appropriate voltages across the piezoelectric layer 212. The actuating layers 202 of the actuating structure have a different thermal response characteristic to that of the beam 204.

The thermal response characteristic of a layer depends on the CTE of the material(s) that makes up the layer. When a layer is added to a structure, the layer produces a thermal effect and the thermal effect of such a layer depends on parameters such as the CTE and Young's Modulus of the material(s) that makes up the layer and on the thickness of the layer. The thermal effect produced by the at least one layer 202 of the actuating structure formed on the mechanical layer 204 and having a different thermal response characteristic to that of the mechanical layer 204 leads to the movement or deflection of the movable structure 203 with variations in temperature.

The thermal compensation structure 206 is different to the actuating layers 202 of the actuating structure and is designed so that its thermal effect when added to the movable structure 203 balances or compensates the thermal effect produced by the mechanical layer and the at least one layer of the actuating structure such that the movement of the beam 204 is substantially independent of variations in temperature. The thermal compensation structure 206 may be different to the actuating layers 202 for example in structure/configuration to the actuating layers and is not symmetric to the actuating layers 202. In the embodiment shown in FIG. 2, the thermal compensation structure 206 comprises one or two layers only. In an example, the thermal compensation layer 206 may comprise a compensation layer formed of material different to that of the actuating layers 202 of the actuating structure. Since the thermal effect of a layer depends on parameters such as the CTE and Young's Modulus of the material(s) that makes up the layer, its position in relation to the other layers and on the thickness of the layer, the thermal compensation structure 206 is arranged to have a thermal effect which compensates or balances the thermal effect produced by the mechanical layer 204 and the at least one layer 202 of the actuating structure by, for example, selecting a material for a thermal compensation layer according to 'intrinsic' parameters such as the CTE, and Young's modulus of the material, and by arranging for the thermal compensation layer 206 to have an appropriate thickness in order to provide the desired compensation.

Figure 1:
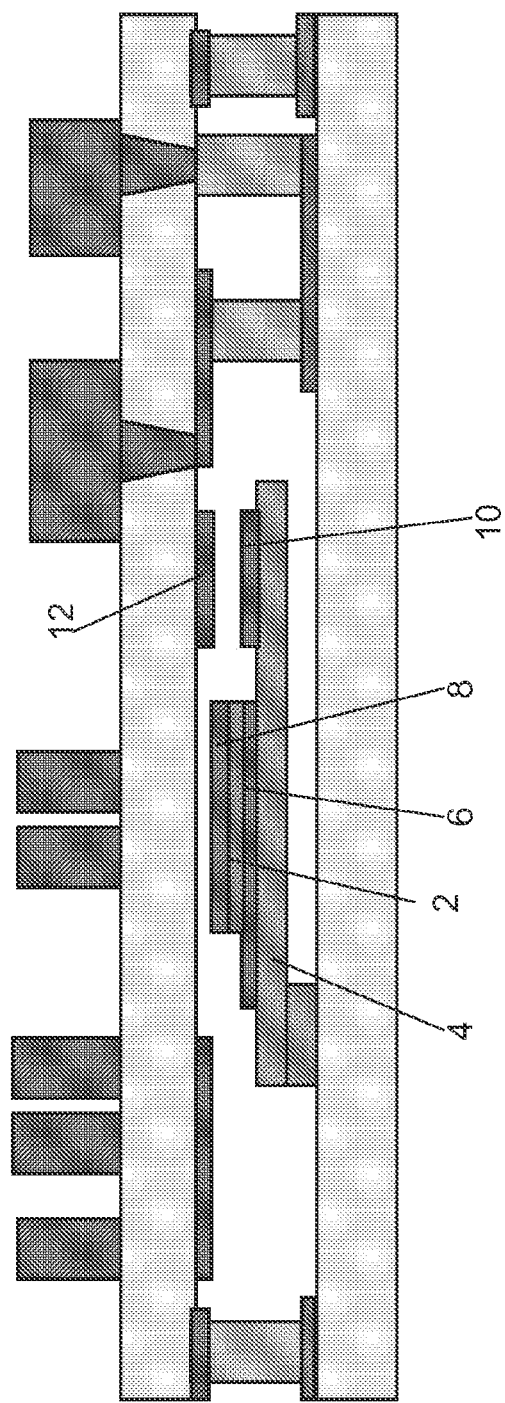
FIG. 1 is a schematic cross-section diagram of part of a typical piezoelectric MEMS switch device.

It will be appreciated that the MEMS switch device 200 may include other elements, such as switch contact pads (see FIG. 1), but these other elements are not shown for simplicity.

In a magnetic actuated MEMS device, the actuating structure includes a magnetic layer instead of a piezoelectric layer formed as part of the movable structure 203.

In the example shown in FIG. 2, the thermal compensation layer 206 and the actuating layers 202 are formed on opposite sides of the beam 204. In this example, the thermal compensation layer 206 is designed so that its CTE is substantially the same as the CTE of the actuating layer 202. Alternatively, the thermal compensation layer 206 may be formed on the same side of the beam 204 as the actuating layers 202.

FIG. 2 also shows the actuating layers 202 being formed on top of the beam 204. It will be appreciated that alternatively, the actuating layers 202 may be formed under the beam 204 with the thermal compensation layer 206 being formed on the opposite side of the beam 204 or on the same side of the beam 204 as the actuating layers 202 as discussed above.

The choice of the CTE of the thermal compensation layer 206 depends on a thickness 220 of the thermal compensation layer and also depends on the material used to form the compensation layer 206. In other words, for a given material for the compensation layer 206, its thickness and its position on the movable structure 203 (e.g. same side of the beam as the actuating layers or on opposite sides) depends on the CTE and the Young's Modulus value of the material.

The thickness and position of the compensation layers can be derived from finite element simulations or analytical analysis.

Figure 3:
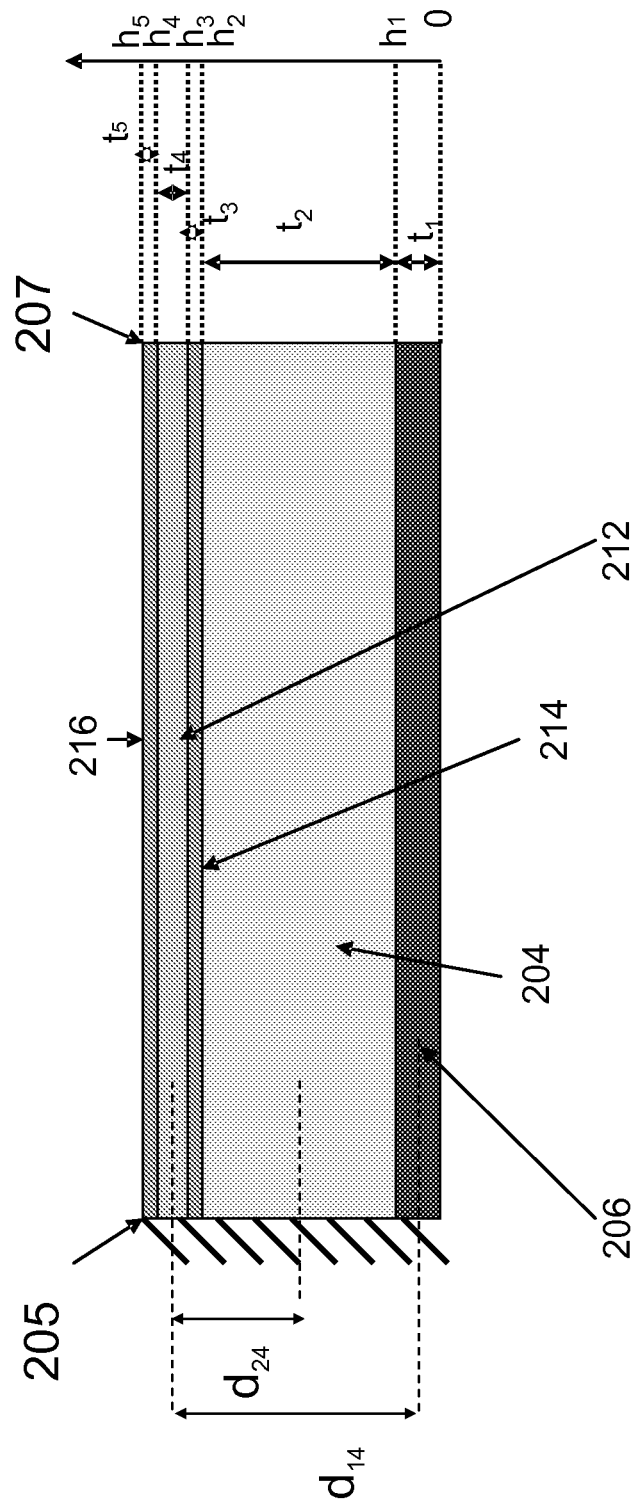
FIG. 3 is a schematic cross-section diagram of the movable structure of FIG. 2 showing the different parameters used to calculate the deflection of the movable structure.

The full mathematical description of the deflection of a free-clamped cantilever beam made of a multilayer can be derived from the publication of Hsueh (C. H. Hsueh, Thermal Stresses in Elastic Multilayer Systems, Thin Solid Film 418 (2002) 182-188). FIG. 3 shows the multilayer movable structure or cantilever shown in FIG. 2 with the parameters used in the mathematical description and having a clamped end 205 and a free end 207.

According to these parameters and based on the publication of Hsueh, one can obtain the deflection δ of the free end 207 of the cantilever due to the thermal effect as:

$$\delta = -\frac{3L^2}{2} \frac{\sum_{i=1}^{5} E_i t_i (c - \alpha_i \Delta T)(2h_{i-1} + t_i)}{\sum_{i=1}^{5} E_i t_i \left[ \begin{array}{c} 6h_{i-1}^2 + 6h_{i-1} t_i + \\ 2t_i^2 - 3t_b(2h_{i-1} + t_i) \end{array} \right]} \quad \text{Equation 1}$$

With $c = \dfrac{\sum_{i=1}^{5}(E_i t_i \alpha_i \Delta T)}{\sum_{i=1}^{5} E_i t_i}$ and $$t_b = \frac{\sum_{i=1}^{5} E_i t_i (2h_{i-1} + t_i)}{2 \sum_{i=1}^{5} E_i t_i}$$

Where: Ei is the Young's modulus of layer i;
ti is the thickness of layer i;
L is the length of the actuator (length 218 shown in FIG. 2);
αi is the CTE of layer i;
hi is the distance between the top of layer i and the bottom of the stack used as origin (note that h0=0);
ΔT is the difference between the working temperature experienced by the device and the reference temperature (typically 25° C.).

In order to compensate (at least partially) the thermal effect and provide a zero degree deflection, the goal is to choose a material and thickness for the compensation layer 206 which induces δ=0 whatever ΔT. According to equation 1 and the value of c, the following equation can be derived first for the deflection of the beam:

$$\delta_T = \frac{-6 \cdot L^2 \cdot \sum_i \sum_{j>i} d_{ij} \cdot E_i \cdot E_j \cdot t_i \cdot t_j (\alpha_j - \alpha_i) \cdot z_{ij}}{\sum_i E_i^2 \cdot t_i^4 + \sum_i \sum_{j>i} E_i \cdot E_j \cdot t_i \cdot t_j \cdot (12 d_{ij}^2 + t_i^2 + t_j^2)} \Delta T_0 \quad \text{Equation 2}$$

where: $\delta_T$ represents the deflection variation of the beam due to temperature, and which is positive for an upward deflection;

$\Delta T0$ is the full working range temperature of the device;

$d_{ij}$ is the distance between layers i and j, measured from the middle of the layers; and $z_{ij}$ is equal to 1 when layer j is above layer i and equals to −1 when layer j is below layer i.

The condition to remove the thermal effect may then be described as:

$$m = \sum_i \sum_{j>i} d_{ij} \cdot E_i \cdot E_j \cdot t_i \cdot t_j (\alpha_i - \alpha_j) \cdot z_{ij} \cdot \Delta T_0 \quad \text{Equation 3a}$$

$$m = 0$$

The deflection described by Equation 2 is due to a bending moment acting on the beam which is proportional to the value of m given by Equation 3a. When m=0, there is no bending moment and so there is no deflection. Thus, by solving equation 3a for m=0, a suitable thickness for the compensation layer 206 may be determined.

Although the disclosure describes reducing the thermal effect for a beam structure having a free end (as shown in FIG. 2), it will be appreciated that the disclosure may also be applied to other structures sensitive to a bending moment, such as the clamped structures shown in FIGS. 11 and 12, where the bending moment may also be proportional to m given by Equation 3a. In the embodiments disclosed in FIGS. 11 and 12, the device comprises a movable structure 1203, 2203 supported or clamped at ends by an anchor 1208, 2208 with at least one layer 1202, 2202 of the actuating structure formed on a portion of the movable structure 1203, 2203. The at least one layer may be formed on a top surface of the movable structure or on a bottom surface of the movable structure 1203, 2203. FIG. 11 shows that the at least one layer of the actuating structure is formed in substantially a central portion of the movable structure and on a top surface of the movable structure and FIG. 12 shows that the at least one layer of the actuating structure is formed on end portions of the movable structure and on a top surface of the movable structure. A thermal compensating structure 1206, 2206 is located with the at least one layer of the actuating structure. The actuating structure may be a piezoelectric, electrostrictive or magnetostrictive structure.

For these kind of transducer devices, it is known that the actuation of the device may be equivalent to a variation of stress (called actuating stress) $\sigma^A$ in an actuating layer. For example, for a piezoelectric actuating layer, it is known that $$\frac{\sigma^A}{E} = \frac{d_{31} V}{T_A}$$

where d31 is the piezoelectric coefficient, V is the voltage applied to the piezoelectric actuating layer, E is the Young's modulus of the layer and $T_A$ is the thickness of the actuating layer.

For a multilayered structure defined by equivalent actuating stress in each layer (eventually equal to 0), the actuating bending moment $m_A$ is then proportional to:

$$m_A = \sum_i \sum_{j>i} d_{ij} \cdot E_i \cdot E_j \cdot t_i \cdot t_j \left( \frac{\sigma_j^A}{E_j} - \frac{\sigma_i^A}{E_i} \right) \cdot z_{ij} = 0 \quad \text{Equation 3b}$$

In an example, the thermal compensation provided by the thermal compensation structure may be designed so that the ratio between m and $m_A$ is small enough to avoid thermal actuation when compared to the regular actuation (e.g. due to applying a voltage to a piezoelectric actuating layer). For example, the material and thicknesses of the layers may be chosen so that $m/m_A$ is less than 50%. In other words, in an example embodiment, a range for the thickness of the compensation layer can be obtained by solving equation 3a and then by using the condition on the ratio between m and $m_A$ given above or some percentage (say 10%) of the solution to equation 3a.

FIG. 11 shows a MEMS device 1000 in accordance with another embodiment of the disclosure comprising a movable structure 1203 which is arranged to be movable in response to actuation of an actuating structure. The movable structure 1203 includes a mechanical structure 1204 comprising a mechanical layer or membrane 1204 supported at ends of the mechanical layer 1204 by anchors 1208. The actuating structure comprises a plurality of layers 1202, including a piezoelectric layer 1212, formed at the ends of the mechanical layer 1204. A thermal compensation structure 1206 comprising at least one thermal compensation layer different to the plurality of layers of the actuating structure is provided at the ends of the mechanical layer 1204 with the layers of the actuating structure to facilitate thermal stability. Like components to those of FIG. 2 are referenced by the same reference numeral plus the number 1000.

FIG. 12 shows a MEMS device 2000 in accordance with another embodiment of the disclosure comprising a movable structure 2203 which is arranged to be movable in response to actuation of an actuating structure. The movable structure 2203 includes a mechanical structure 2204 comprising a mechanical layer or membrane 2204 supported at ends of the mechanical layer 2204 by anchors 2208. The actuating structure comprises a plurality of layers 2202, including a piezoelectric layer 2212, formed at substantially the centre of the mechanical layer 2204. A thermal compensation structure 2206 comprising at least one thermal compensation layer different to the plurality of layers of the actuating structure is provided at substantially the centre of the mechanical layer 2204 with the layers of the actuating structure to facilitate thermal stability. Like components to those of FIG. 2 are referenced by the same reference numeral plus the number 2000.

As Ei, αi, ti, hi are known for all the materials involved in the multilayer movable structure 203, theoretically, many different materials which are technologically compatible with the manufacturing processes used to form the multilayer movable structure can be chosen for compensating thermally the movable structure. Indeed, if one chooses a material for compensation, E and α are known for this material and the last unknown is a suitable thickness t of this layer which can be determined by solving equation 3a. However, in some cases, the resolution of equation 3a can induce a negative thickness which means that there is no solution.

Equation 3a defines the targeted specifications for the compensation layer 206 for when the goal for the deflection of the movable structure relative to the substrate 210 is to be independent of temperature. For each application of the MEMS device, it is possible, starting from the product specifications, to define a maximum acceptable deflection variation δm over a temperature range: that is, the deflection amount due to temperature variations may be non-zero. For example, for a RF MEMS switch, δm will be defined to maintain the isolation characteristics of the switch for the OFF state, and so that the theoretical deflection for the ON state is always higher than the gap. In general, for an actuator defined by its maximum deflection variation δa between ON and OFF state at room temperature, δm can be defined as a fraction of δa, for example 50%.

Equation 2 can be used in this case to define a range of possible values for the specifications of the compensation layer 206 by targeting a value of δT lower than δm over the full temperature range.

A first way to simplify equation 2 is to make the assumption that the thickness of the layer called "the compensation layer 206" is small at least when compared to some of the other layers. More precisely, it is assumed that, choosing n for the numbering of the thermal compensation layer, equation 2 can be approximated by $$\delta_T = \frac{-6 \cdot L^2 \cdot \left[ \sum_{i \neq N} \sum_{N > j > i} d_{ij}^* \cdot E_i \cdot E_j \cdot t_i \cdot t_j (\alpha_j - \alpha_i) \cdot z_{ij} + t_N \cdot \sum_{i \neq N} d_{iN}^* \cdot E_i \cdot E_N \cdot t_i (\alpha_N - \alpha_i) \cdot z_{iN} \right]}{\sum_{i \neq N} E_i^2 \cdot t_i^4 + \sum_{i \neq N} \sum_{N > j > i} E_i \cdot E_j \cdot t_i \cdot t_j \cdot (12 d_{ij}^{*2} + t_i^2 + t_j^2)} \Delta \quad \text{Equation 4}$$

Where: dij* is the distance between the layers i and j without taking into account the thickness of layer N.

The thickness of the compensation layer is then given by $$t_N = \frac{-\sum_{i \neq N} \sum_{N > j > i} d_{ij}^* \cdot E_i \cdot E_j \cdot t_i \cdot t_j (\alpha_j - \alpha_i) \cdot z_{ij}}{\sum_{i \neq N} d_{iN}^* \cdot E_i \cdot E_N \cdot t_i \cdot (\alpha_N - \alpha_i) \cdot z_{iN}} \quad \text{Equation 5}$$

In order to ensure that the thickness given by equation 5 is positive, the position of layer N on the stack downward or upward can be moved to provide a solution with a positive value since the sign of the denominator of Equation 5 takes two opposite values when layer N moves from the top of the stack (zNi always positive) to the bottom of the stack (zNi always negative).

In order for a value given by equation 5 for the thickness of the compensation layer to be an acceptable solution, the value cannot be too high so as to avoid having very thick thermal compensation layers. Thus, in order to provide a small value for tN, it is better to choose a thermal compensation layer which has a thermal characteristic as different as possible to the thermal characteristic of the thicker layers.

Figure 10:
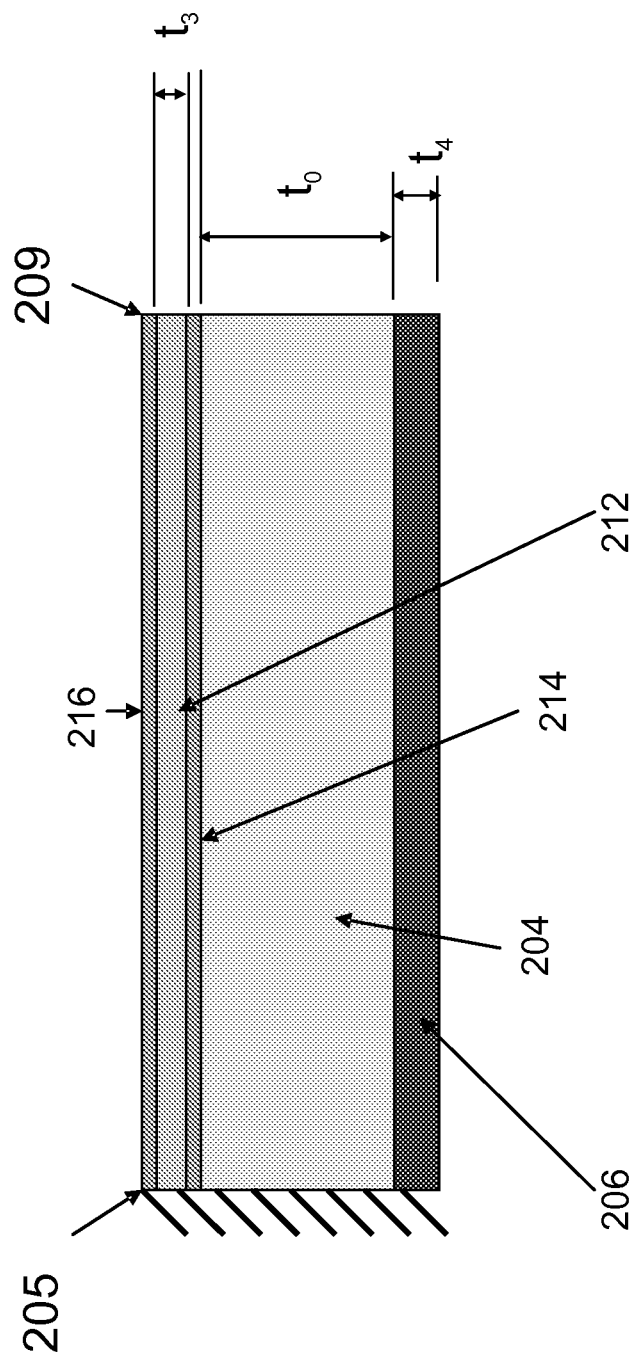
FIG. 10 is a schematic cross-section diagram of the movable structure of FIG. 2 showing parameters used to calculate the deflection of the movable structure.

Another way to simplify this equation 2 is to make the assumption that the thickness of all the layers are small compared to one layer. In a practical example, the one layer is called the mechanical layer 204. With this assumption, equations 2 and 3 can be approximated as $$\delta_T = \frac{-3L^2}{E_0 \cdot t_0^2} \sum_{i \neq 0} \cdot E_i \cdot \overline{t_i} \cdot (\alpha_i - \alpha_0) \quad \text{Equation 6a}$$

$$\sum_{i \neq 0} \cdot E_i \cdot \overline{t_i} \cdot (\alpha_0 - \alpha_i) = 0 \quad \text{Equation 6b}$$

where: i=0 is the thickest mechanical layer having a thickness of $t_0$, $\overline{t_i}$ is the algebraic thickness, positive on top of the mechanical layer and negative below the mechanical layer as shown for example in FIG. 10 where $\overline{t4}$=−t4, and $\overline{t3}$=t3.

In this case, starting from a given material for all the layers 1 to n−1 (except one noted n), there is always a given algebraic thickness (i.e. thickness and position (top or bottom)) for the nth layer given by the equation:

$$\overline{t_n} = \frac{\sum_{i=1}^{n-1} E_i \overline{t_i} (\alpha_i - \alpha_0)}{E_n (\alpha_0 - \alpha_n)} \quad \text{Equation 7}$$

Depending on the value of CTE, the position of the compensation layer 206 can be on the side of the actuating layers 202 or on the opposite side. The algebraic thickness of the compensation layer 206 is not only dependent on CTE but depends also on the value of the Young's modulus of the material used for the compensation layer 206. In order to avoid having only a compensation layer which exhibits a second order thermal effect, a compensation layer 206 with a CTE different from the CTE of the mechanical layer 204 may be used which confirms what was deduced from equation 5.

Equations 5 or 7 can be used to find a first set of parameters for an approximated solution. This first set can then be adjusted by using equation 4 or a finite element simulation.

Once again, equation 5 and 7 gives the targeted thickness for the compensation layer 206 and equation 6a can be used to define a range of acceptable values when comparing δ0 to δm.

When a solution for the thermal compensation has been found, equations 4 and 6a can be represented generally by $$\delta_T = a_0 \cdot t_N - \delta_0 \quad \text{Equation 8}$$

where δ0 and a0 are independent of the value of tN and have the same sign (because the ratio δ0 over a0 is the thickness for thermal effect cancellation).

Equation 4 gives, for example, the values of δ0 and a0 as:

$$\delta_0 = \frac{6 \cdot L^2 \cdot \left[ \sum_{i \neq N} \sum_{N > j > i} d_{ij}^* \cdot E_i \cdot E_j \cdot t_i \cdot t_j (\alpha_j - \alpha_i) \cdot z_{ij} \right]}{\sum_{i \neq N} E_i^2 \cdot t_i^4 + \sum_{i \neq N} \sum_{N > j > i} E_i \cdot E_j \cdot t_i \cdot t_j \cdot (12 d_{ij}^{*2} + t_i^2 + t_j^2)} \Delta T_0$$

$$a_0 = \frac{-6 \cdot L^2 \cdot \left[ \sum_{i \neq N} d_{iN}^* \cdot E_i \cdot E_N \cdot t_i (\alpha_N - \alpha_i) \cdot z_{iN} \right]}{\sum_{i \neq N} E_i^2 \cdot t_i^4 + \sum_{i \neq N} \sum_{N > j > i} E_i \cdot E_j \cdot t_i \cdot t_j \cdot (12 d_{ij}^{*2} + t_i^2 + t_j^2)} \Delta T_0$$

In this case, for a maximum thermal deflection lower than a given value of δm, the range of possible thicknesses for the compensation layer is $$\frac{\delta_0}{a_0} - \frac{\delta_m}{|a_0|} < t_N < \frac{\delta_0}{a_0} + \frac{\delta_m}{|a_0|} \qquad \text{Equation 9}$$

Examples of materials suitable for a compensation layer 206 with a SiN mechanical layer or beam 204 (having a CTE=2.1 ppm/° C.), include: TiN, Pt, WSi (all having a CTE around 9 ppm/° C.).

In the example shown in FIG. 2, the actuating layers 202 extend a length 218 across the beam 204 and the thermal compensation layer 206 extends substantially the same length 218 across the beam 204 such that the actuating layers 202 and the thermal compensation layer 206 have substantially the same coverage areas in a plane substantially parallel to the beam 204. By having the same coverage areas across the beam 204 it may be ensured that the moment caused by the thermal effect all along the length of the beam is cancelled or at least reduced.

In an example, the actuating layers 202 may comprise at least one piezoelectric capacitor including a piezoelectric layer 212 formed between first 214 and second 216 electrodes. The actuating layers 202 may alternatively include a plurality of piezoelectric capacitors stacked as in the arrangement disclosed in US patent application publication no. 2005/0127792, incorporated herein by reference. In an example, the piezoelectric layer 212 may be formed from PZT material and thus comprises a PZT layer 212 and the first 214 and second 216 electrodes are platinum electrodes. With the actuating layers 202 comprising Pt/PZT/Pt layers, the thermal compensation layer 206 may comprise a platinum layer, a titanium nitride layer, tungsten silicide layer, titanium tungsten layer, titanium, tungsten nitride layer, tungsten nitride layer or other layer of similar material or one or two layers of any combinations of these materials in order for the CTE of the thermal compensation layer 206 to thermally compensate for the actuating layers 202. For the example having a titanium nitride thermal compensation layer 206, the titanium nitride thermal compensation layer 206 has a CTE of approximately 8-9 ppm/° C., the Pt/PZT/PT actuating layers have a CTE of 9.5 ppm/° C. and the beam 204 being formed of silicon nitride has a CTE of 2-3 ppm/° C. and thus, thermal balance can be achieved.

Figure 4:
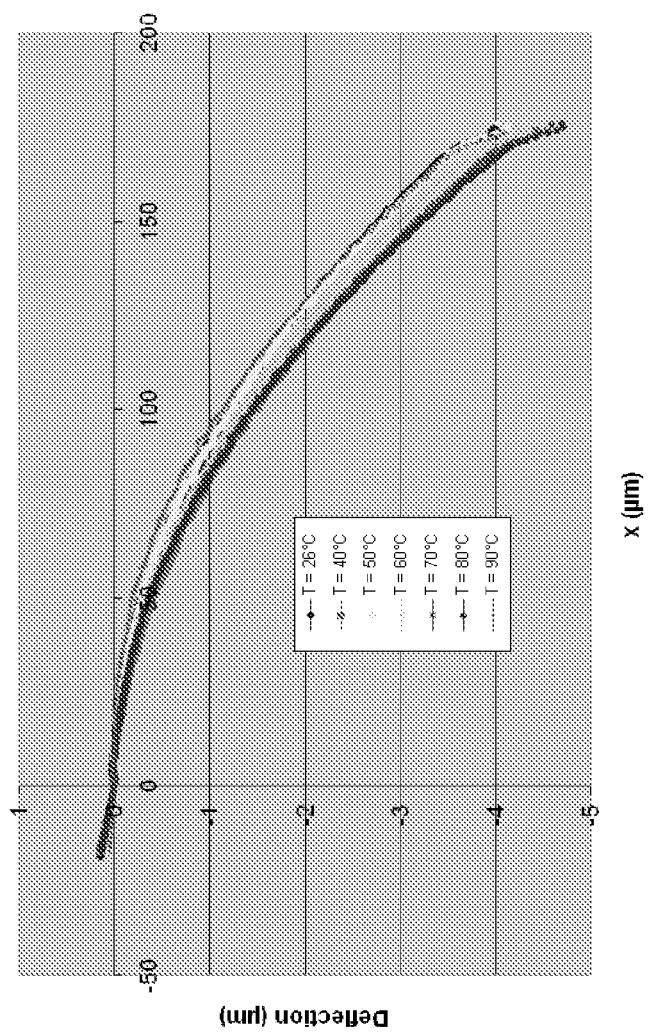
FIG. 4 is a graphical representation of the variation in the deflection of a PZT actuated beam as shown in FIG. 2 at different operating temperatures.

FIG. 4 is a graph showing the variation in the deflection of a PZT actuated beam as shown in FIG. 2 at different operating temperatures ranging from 25° to 90° across the length of the beam with a titanium nitride thermal compensation layer 206 and a silicon nitride beam 204. As can be seen from the graph, there is little variation in deflection (<0.5 μm) with the operating temperature ranging from 25° to 90°. In FIG. 4, X=0 corresponds to the clamped end 205 of the beam 204.

For a clamped structure, such as that shown in FIG. 11 or 12, the average value of the stress induces a change in the elasticity of the structure. This is a second order effect on the deflection when compared to the effect of the stress gradient due to the different layers of the multilayered structure and thermal effects, especially if the mechanical structure has a CTE close to the substrate (which is the case when the substrate is a silicon substrate and the beam is formed of silicon nitride).

An example of a method of forming an electromechanical transducer device in accordance with an embodiment of the present disclosure will now be described with reference to FIGS. 2, 5-9 in which only part of the transducer device is shown, for simplicity.

Figure 5:
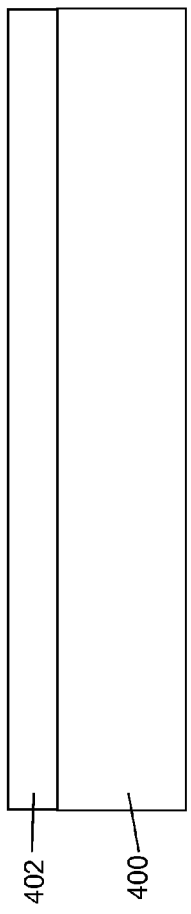
FIGS. 5-9 are schematic cross-section diagrams of the part of the micro electromechanical transducer device of FIG. 2 during different stages of fabrication.

As shown in FIG. 5, a semiconductor substrate 400 is provided and a sacrificial layer 402 is formed over the semiconductor substrate 400. The semiconductor substrate described herein can be any semiconductor material or combinations of materials, such as gallium nitride, silicon carbide, silicon-on-insulator (SOI), silicon, monocrystalline silicon, the like, and combinations of the above. The sacrificial layer 402 is, for example, a 1 μm thick amorphous silicon layer which may be deposited using Plasma Enhanced Chemical Vapor Deposition PECVD. The thickness of the sacrificial layer 402 determines the height of the air gap between the thermal compensation layer 206 (of FIG. 2) and the substrate 400 (210 of FIG. 2). The sacrificial layer 402 may be formed from other materials such as silicon, polysilicon, silicon dioxide.

Figure 6:
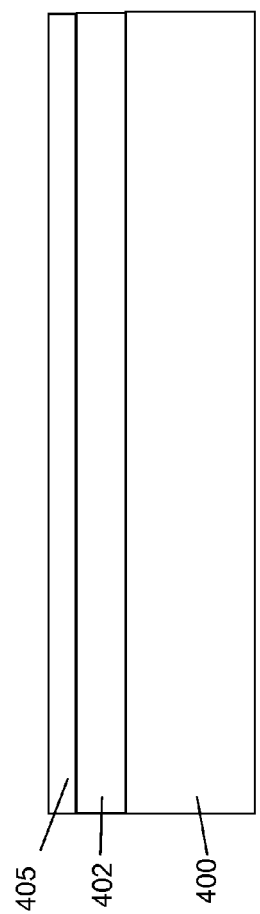
Figure 7:
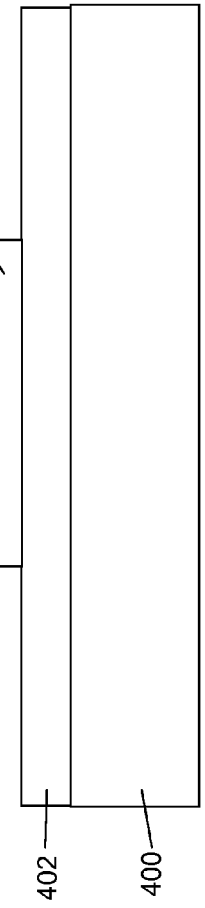

A layer 405 is then deposited over the sacrificial layer 402 as shown in FIG. 6. Layer 405 is then patterned and etched to form the thermal compensation layer 206 (of FIG. 2). In the embodiment shown, the layer 405 is a single layer of titanium nitride deposited by Physical Vapor Deposition (PVD) which forms a single layer thermal compensation layer 206 having a thickness of 10 nm-300 nm. Other materials which may be used for the thermal compensation layer 206 include platinum, titanium nitride, tungsten silicide, titanium tungsten, titanium, tungsten nitride, tungsten nitride or other similar materials or any combinations thereof. In the case of the thermal compensation layer 206 comprising more than one layer, then the other layers would be deposited, patterned and etched at this stage. The number of layers and the type of material(s) used for the one or more layers and the thickness of the layers are selected according to the desired thermal effect which compensates or balances the thermal effect of the beam 204 and the actuating layers 202 and thus, may be selected depending on the thickness and the thermal response characteristic of each of the beam 204 and the actuating layer 202.

Figure 8:
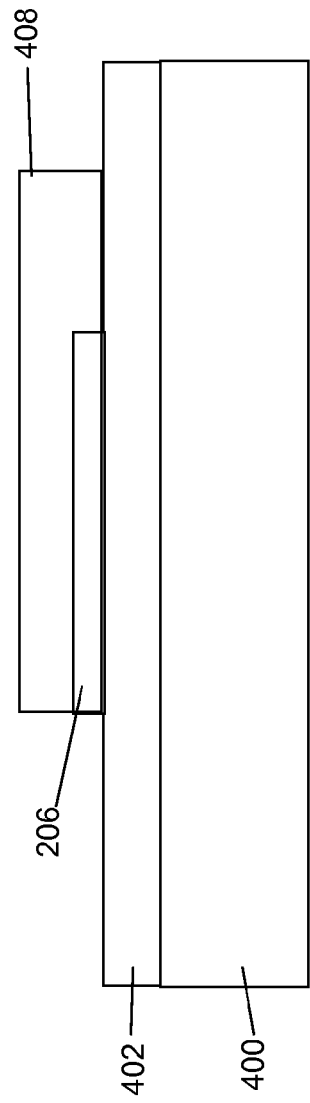

A layer 408 is then deposited over the sacrificial layer 402, and the thermal compensation layer 206, FIG. 8. The layer 408 is then patterned and etched to form the beam 204 which will provide support and mechanical strength to the final released structure. In an embodiment, the layer 408 is a silicon nitride layer which is deposited using LPCVD. However, other materials may be used instead for layer 408 such as silicon dioxide or silicon/oxide/nitride, silicon, polysilicon, aluminium nitride or similar dielectric materials. The layer 408 can be patterned at this stage or later depending on the etch method used for the piezoelectric layer 212 of FIG. 9. For example, should the piezoelectric layer 212 of FIG. 9 be etched through a dry etch process, the layer 408 can be patterned at this stage. Should the piezoelectric layer 212 of FIG. 9 be etched by means of a wet etch process, the layer 408 is patterned at a later stage so that it may serve to protect the underlying sacrificial layer 402 from the etching chemicals.

Figure 9:
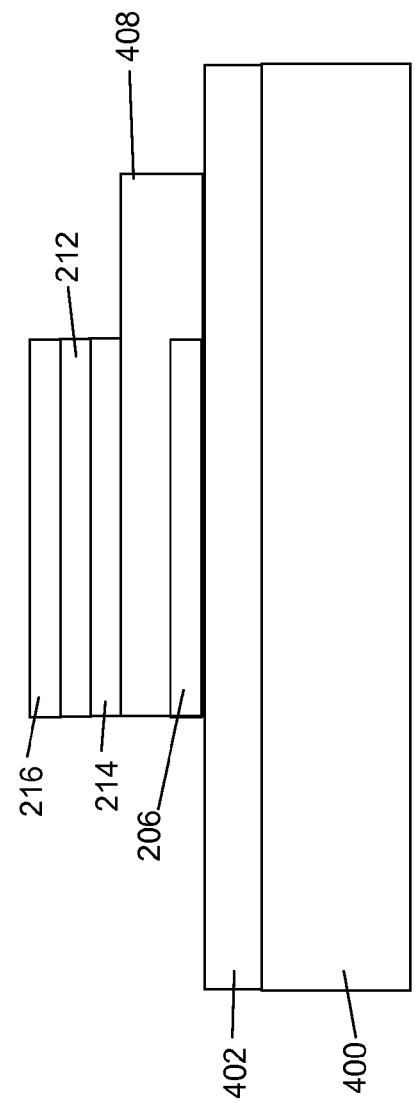

As shown in FIG. 9, the first electrode 214 is then formed on the layer 408. For example, the first electrode 214 is formed using sputter deposition and a lift-off process which is well known in the art. In an embodiment, the first electrode 214 is a platinum electrode having a thickness of 50 nm to 500 nm. In another embodiment, the first electrode 214 may be formed from ruthenium oxide, iridium, iridium oxide, ruthenium, ruthenium dioxide, gold, copper or other suitable metal.

A piezoelectric layer 212 is then formed over the first electrode 214. The piezoelectric layer 212 is, for example, formed from a PZT layer having a thickness of 50 nm to 3 µm, deposited using, for example, a sol-gel deposition process and then patterned and etched using a variety of dry or wet etch techniques. Alternative materials for the piezoelectric layer 212 include zinc oxide, aluminium nitride, PLZT, PMNT or similar materials.

The second electrode 216 is then formed on the layer piezoelectric layer 212. For example, the second electrode 216 is formed using sputter deposition and a lift-off process which is well known in the art. In an embodiment, the second electrode 216 is also a platinum electrode having a thickness of 50 nm to 500 nm. In another embodiment, the second electrode 214 may be formed from ruthenium oxide, iridium, iridium oxide, ruthenium, ruthenium dioxide, gold, copper or other suitable metal. The second electrode 216 may be formed from the same metal or a different metal as the first electrode 214.

The thermal compensation layer 206 and the Pt/PZT/Pt layers 202 are arranged to have the same coverage areas over the surfaces of the beam 204. Photolithography may be used to align the different layers.

Although not shown, additional piezoelectric layers may then be formed so as to provide a structure having several stacked piezoelectric capacitors.

It will be appreciated that, although not shown and described, at least one anchor 208 will be formed during the formation of the MEMS switch device 200 to support the movable structure 203 on the substrate 210.

The manufacturing of the MEMS transducer device may then be continued according to standard processes. This may include, for example, performing an anneal step and forming the last metal layer. Furthermore, the sacrificial layers 402 and 406 are then removed by using chemical release methods known in the art, for example by means of hydrofluoric acid so as to provide the structure as shown in FIG. 2.

As discussed above, for simplicity the manufacture of only part of a transducer device has been described. It would be clear to a person skilled in the art how to form other elements of the device such as the switch contact pads.

In summary, the transducer device for example as described with reference to FIG. 2 uses a thermal compensation layer to balance or compensate the thermal effect of the movable structure including the at least one actuating layer and the mechanical layer so as to provide a device that is thermally stable over a wide temperature range. By using a thermal compensation layer which is different to the at least one actuating layer, for example comprising one or two layers only, or formed of a different material which is compatible with the process, the transducer device in accordance with the disclosure does not need to use a compensating structure which is symmetrical with the actuating structure and thus, thermal stability can be achieved without a significant increase in cost or process complexity. In the case of piezoelectric actuated devices, very complex symmetrical compensation structures can be avoided which means that thermal balance can be achieved with the number of processing steps and variations due to manufacturing process variations reduced significantly compared to a symmetric compensation structure. Also, any contamination issues due to forming the compensation structure before the mechanical layer deposition can be avoided.

In the above, the invention has been described with reference to a cantilevered beam structure. It will however be appreciated that the thermal compensation layer as described above can be applied to other beam arrangements (e.g. doubly supported beams) or plates or similar arrangements with at least one free end or at least one unsupported end or clamped structures (with supported or clamped ends) and is not limited to cantilevered beam structures. More generally, the thermal compensation structure as described above can be applied to devices that are designed to be actuated by using the generation of stress in a layer to induce a bending moment.

In the foregoing specification, the invention has been described with reference to specific examples of embodiments of the invention. It will, however, be evident that various modifications and changes may be made therein without departing from the broader scope of the invention as set forth in the appended claims.

The invention claimed is:

1. A micro or nano electromechanical transducer device formed on a semiconductor substrate comprising:
 a movable structure being arranged to be movable in response to actuation of an actuating structure and comprising:
  a mechanical structure having at least one mechanical layer having a first thermal response characteristic;
  at least one layer of the actuating structure, the at least one layer having a second thermal response characteristic different to the first thermal response characteristic; and
  a thermal compensation structure having at least one thermal compensation layer being different to the at least one layer of the actuating structure, and wherein the thermal compensation structure is arranged to compensate a thermal effect produced by the mechanical structure and the at least one layer of the actuating structure such that movement of the movable structure is substantially independent of variations in temperature;
 wherein the actuating structure includes a plurality of layers including a magnetic layer and the plurality of layers form part of the movable structure, the movable structure being movable in response to magnetic actuation plurality of layers.

2. The micro or nano electromechanical transducer device of claim 1, wherein the thermal compensation structure comprises less layers than the actuating structure.

3. The micro or nano electromechanical transducer device of claim 1, wherein the plurality of layers includes a magnetic layer between first and second electrode layers.

4. The micro or nano electromechanical transducer device of claim 1, wherein the thermal compensation structure comprises one or two layers only.

5. The micro or nano electromechanical transducer device of claim 1, wherein the at least one layer of the actuating structure is formed of a first material and the thermal compensation structure comprises a layer formed of a compensation material different to the first material.

6. The micro or nano electromechanical transducer device of claim 1, further comprising a substrate and wherein the actuating structure further comprises a layer formed on the substrate.

7. The micro or nano electromechanical transducer device of claim 1, wherein the thermal compensation structure is adjacent the mechanical layer.

8. The micro or nano electromechanical transducer device of claim 1, wherein the thermal compensation structure is formed of compensation material selected according to the Coefficient of Thermal Expansion and Young's modulus of the compensation material and has a predetermined thickness in order to compensate the thermal effect.

9. The micro or nano electromechanical transducer device of claim 1, wherein the thermal compensation structure has a third thermal response characteristic and is formed from at least a compensation material, and wherein the third thermal response characteristic depends on the Coefficient of Thermal Expansion of the compensation material.

10. The micro or nano electromechanical transducer device of claim 1, wherein the thermal compensation structure has substantially the same Coefficient of Thermal Expansion as the at least one layer of the actuating structure.

11. The micro or nano electromechanical transducer device of claim 1, wherein the thermal compensation structure and the at least one layer of the actuating structure forming part of the movable structure are formed on opposite sides of the mechanical structure.

12. The micro or nano electromechanical transducer device of claim 1, wherein the at least one layer of the actuating structure forming part of the movable structure occupies a first area in a plane substantially parallel to the mechanical structure and wherein the thermal compensation structure occupies a second area in a plane substantially parallel to the mechanical structure, wherein the second area is substantially the same as the first area.

13. The micro or nano electromechanical transducer device of claim 1, further comprising a semiconductor substrate and an anchor formed on the semiconductor substrate for supporting the movable structure, wherein the movable structure has at least one unsupported end.

14. The micro or nano electromechanical transducer device of claim 1, further comprising a semiconductor substrate and anchors formed on the semiconductor substrate for supporting the movable structure at ends of the movable structure, wherein the at least one layer of the actuating structure and the at least one thermal compensation layer are on a portion of the movable structure.

15. The micro or nano electromechanical transducer device of claim 8, wherein the predetermined thickness of the compensation layer is obtained by solving the following equation:

$$\sum_i \sum_{j>i} d_{ij} \cdot E_i \cdot E_j \cdot t_i \cdot t_j (\alpha_i - \alpha_j) \cdot z_{ij} \cdot \Delta T_0 = 0$$

Where: $E_i$ is the Young's modulus of layer i;
  $t_i$ is the thickness of layer i;
  $a_i$ is the CTE of layer i;
  $d_{ij}$ is the distance between layers i and j, measured from the middle of the layers; and
  $z_{ij}$ is equal to 1 when layer j is above layer i and equals to −1 when layer j is below layer i.

16. A method of forming a micro or nano electromechanical transducer device on a semiconductor substrate comprising a movable structure being arranged to be movable in response to actuation of an actuating structure, the method comprising forming the movable structure by;
  providing a mechanical structure having at least one mechanical layer having a first thermal response characteristic;
  providing at least one layer of the actuating structure, the at least one layer having a second thermal response characteristic different to the first thermal response characteristic; and
  providing a thermal compensation structure having at least one thermal compensation layer being different to the at least one layer of the actuating structure and being arranged to compensate a thermal effect produced by the mechanical structure and the at least one layer of the actuating structure such that the movement of the movable structure is substantially independent of variations in temperature;
  wherein the actuating structure includes a plurality of layers including a plurality of piezoelectric layers, and the plurality of layers form part of the movable structure, the movable structure being movable in response to piezoelectric actuation of the plurality of layers.

17. The method of claim 16, further comprising further comprising selecting a material for the thermal compensation structure according to the Coefficient of Thermal Expansion and Young's modulus of the material, and arranging for the thermal compensation structure to have a predetermined thickness in order to compensate the thermal effect.

18. The method of claim 16, wherein the predetermined thickness of the compensation layer is obtained by solving the following equation:

$$\sum_i \sum_{j>i} d_{ij} \cdot E_i \cdot E_j \cdot t_i \cdot t_j (\alpha_i - \alpha_j) \cdot z_{ij} \cdot \Delta T_0 = 0$$

Where: $E_i$ is the Young's modulus of layer i;
  $t_i$ is the thickness of layer i;
  $a_i$ is the CTE of layer i;
  $d_{ij}$ is the distance between layers i and j, measured from the middle of the layers; and
  $z_{ij}$ is equal to 1 when layer j is above layer i and equals to −1 when layer j is below layer i.

* * * * *